1/10/84 XR 4,425,525

United States Patent [19]

Smith et al.

[11] 4,425,525

[45] Jan. 10, 1984

[54] ULTRASONIC TRANSDUCER ARRAY SHADING

[75] Inventors: Lowell S. Smith, Schenectady, N.Y.; Axel F. Brisken, Shingle Springs; Michael S. Horner, Davis, both of Calif.

[73] Assignee: General Electric Company, Schenectady, N.Y.

[21] Appl. No.: 349,146

[22] Filed: Feb. 16, 1982

[51] Int. Cl.[3] .............................................. H01L 41/22

[52] U.S. Cl. .................................... 310/336; 310/334; 310/367

[58] Field of Search ............... 310/368, 335, 334, 336, 310/367; 367/153, 155

[56] References Cited

U.S. PATENT DOCUMENTS 4,167,686 9/1979 Fukuyo .............................. 310/361

4,211,948 7/1980 Smith et al. ......................... 310/322

4,245,173 1/1981 Zumsteg et al. ...................... 310/361

4,305,014 12/1981 Borburgh et al. .................. 310/334

*Primary Examiner*—J. D. Miller

*Assistant Examiner*—D. L. Rebsch

*Attorney, Agent, or Firm*—Donald R. Campbell; James C. Davis, Jr.; Marvin Snyder

[57] ABSTRACT

A linear array for rectilinear and sector scan imaging has identical approximately diamond-shaped transducer elements fabricated by making two pairs of straight line cuts at small angles through a piezoelectric slab. The Y-axis radiation pattern (parallel to element length and perpendicular to the array length) has lower side lobe levels than equal sized rectangular elements. No changes in the imager electronics among channels is required, and the shading function may be modified by changing only the transducer.

6 Claims, 6 Drawing Figures

ULTRASONIC TRANSDUCER ARRAY SHADING

BACKGROUND OF THE INVENTION

This invention relates to improving the beam pattern of an ultrasonic transducer array in the direction perpendicular to the array length.

The radiation pattern from an aperture can be described by diffraction theory. If the pattern is measured in the far field of the aperture, it is the Fourier transform of the aperture function. Thus, for a rectangular aperture the pattern has side lobes at −13 dB (one way). The present invention demonstrates a technique to improve the beam pattern by reducing the energy in the side lobes, and this is achieved entirely within the transducer.

In linear phased array, real time imaging systems, the beam pattern in the image plane and along the array (X-axis) is controlled primarily by the system electronics. The beam pattern in the perpendicular plane (Y-axis) cannot be altered by the system electronics, and is determined solely by the array architecture. Conventional arrays, such as those with long, narrow rectangular elements, have Y-axis beam profiles which exhibit substantial side lobe levels.

Concurrently filed application Ser. No. 349,143, "Ultrasonic Transducer Shading", L. S. Smith and A. F. Brisken, which is assigned to the same assignee, discloses and claims several techniques for shading single element transducers and arrays such that the intensity of emitted radiation is higher at the center of the transducer and lower at the edges and which realize a reduction in side lobes. These include changing the piezoelectric conversion efficiency or polarization as a function of position, having different element lengths, selectively poling the piezoelectric material to yield poled and unpoled regions, and control of electrode geometry. Both X-axis and Y-axis shading are described; the shading function is, for example, the raised cosine or Hamming, and there are many others. Phased arrays may be shaded by the first three techniques. One configuration not suitable for phased arrays is a large slab rectangular element with independent shading of the Y-axis because one electrode covers the whole length and the other electrode covers part of the length.

SUMMARY OF THE INVENTION

A shaded linear tranducer array has substantially identical transducer elements which are shaped to have more radiating surface and are wider in the center than at the ends of the individual elements. Preferably they are approximately diamond-shaped. The intensity of emitted ultrasound, in the Y-axis direction perpendicular to the array length (parallel to the element length), is greater at the center and lower at the ends and the radiation pattern in that direction has reduced side lobe levels.

Such an array with diamond-shaped elements is conveniently manufactured by making straight line cuts of small angles to one another completely through a plated rectangular slab of piezoelectric material.

When used with phased array or rectilinear imaging systems, this shading technique has the advantage that it improves the Y-axis radiation pattern without requiring changes in the electronics for different X-channel elements. The shading function may therefore be modified by changing only the transducer.

DESCRIPTION OF THE PREFERRED EMBODIMENTS

Figure 1:
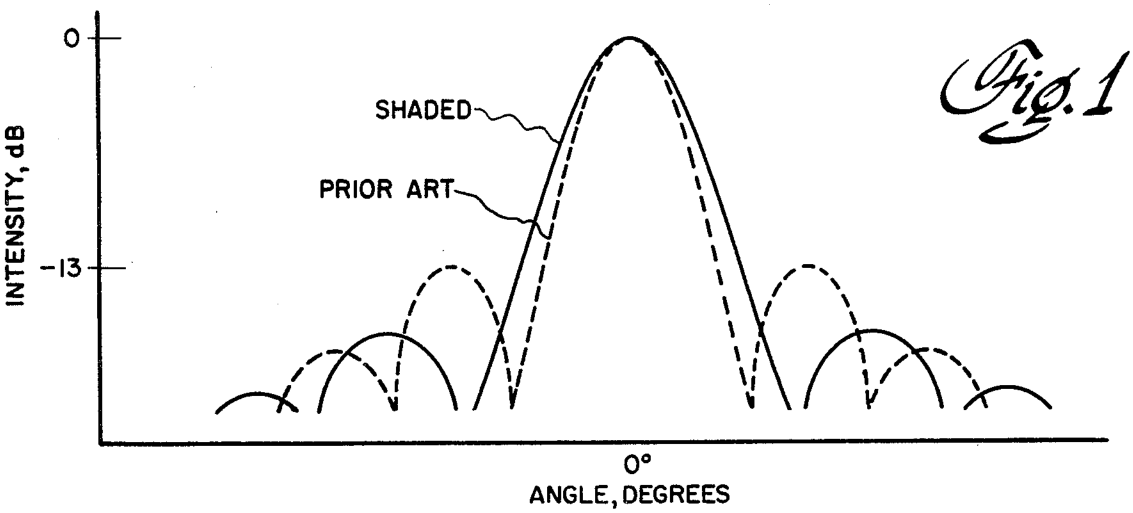
FIG. 1 shows the Y-axis beam profiles of a prior art array with long rectangular elements and of an array of this invention.

A typical linear transducer array for rectilinear and sector scan imaging has long, rectangular transducer elements such as those shown in FIG. 1 of Brisken and Smith U.S. Pat. No. 4,217,684. Every element in the array is exactly like all other elements in the array. It has been the common practice in the prior art devices to isolate individual elements by saw cuts normal to the array length. The radiation pattern of this type of array is shown in dashed lines in FIG. 1 and has substantial side lobe levels. However, a dramatic improvement is realized by using array elements with a different shape.

An improvement is attained by any physical shape which leaves more radiating surface at the center than at the ends of the individual elements. It is crucial to the success of the technique that the radiating surface of the individual elements have a physical shape that is shaded in the appropriate direction, rather than just an electrode of that shape. In these small width elements, on the order of one wavelength at the emission frequency, the normal modes of vibration are strongly coupled to any excitation so that the entire element oscillates for any applied signal. The elements according to this invention are wider at the center than at the ends and are fully cut through.

Figure 2:
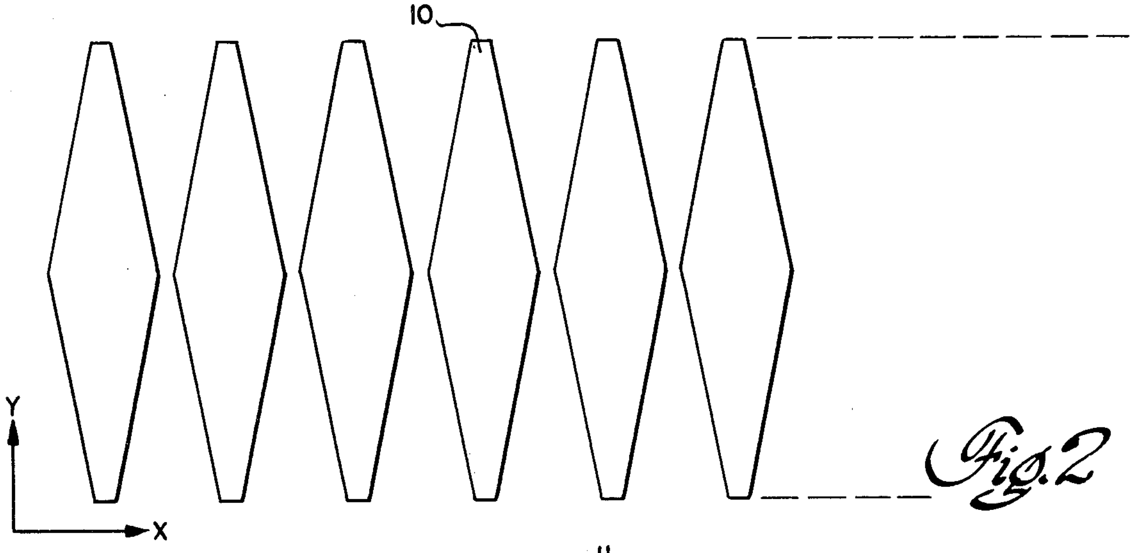
FIG. 2 is a top view of a linear array with roughly diamond-shaped elements.
Figure 3:
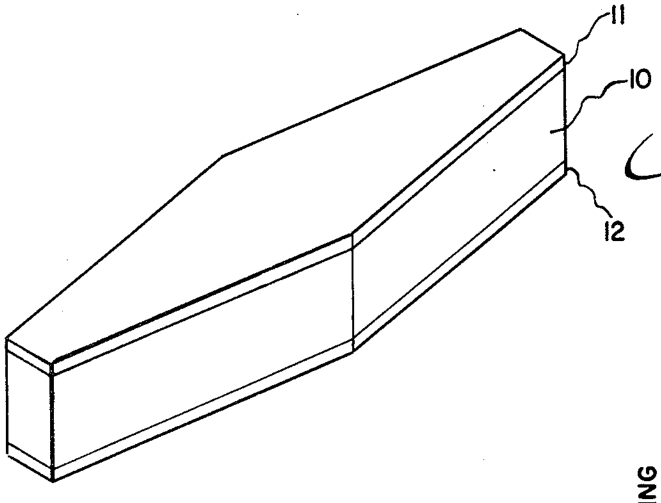
FIG. 3 is an isometric view of one element.

It is to convenient to make this kind of element using a semiconducting dicing saw which can only make straight line cuts. For this reason, the preferred embodiment of the invention is an array where each element is separated from its neighbor by two cuts at slight angles to each other. This array is illustrated in FIGS. 2 and 3. The resulting elements 10 are approximately diamond-shaped and have many properties similar to rectangular array elements. However, since the Y-axis aperture is shaded, the radiation pattern in that direction is wider and has lower side lobes than an equal sized rectangular element. This is shown in FIG. 1. In the direction parallel to the element length and normal to the array length, the intensity of emitted radiation is greater at the center of the elements than at the ends, and the energy in the side lobes is reduced. The signal and ground electrodes on opposite surfaces of the diamond-shaped element 10 are indicated at 11 and 12.

Figure 4:
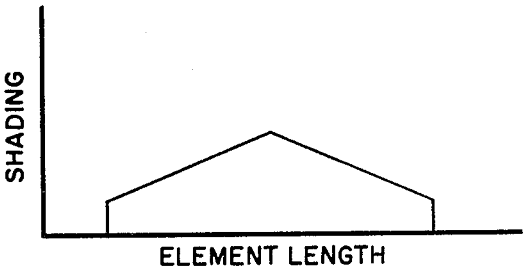
FIG. 4 shows the shading function.

The shading function of the diamond-shaped element is continuous and is larger in the center than at the ends. A typical shading function is illustrated in FIG. 4. The choice of shading function depends on the specific requirement and the need to retain good resolution considering that a uniformly weighted aperture gives the best resolution. The radiation pattern of the shaded array represents a slightly degraded resolution because the main lobe is wider.

The improvement in the Y-axis beam profile is achieved entirely within the ultrasonic transducer and thus requires no modification of the system electronics among channels. The shading function may be modified by changing only the transducer.

Figure 6:
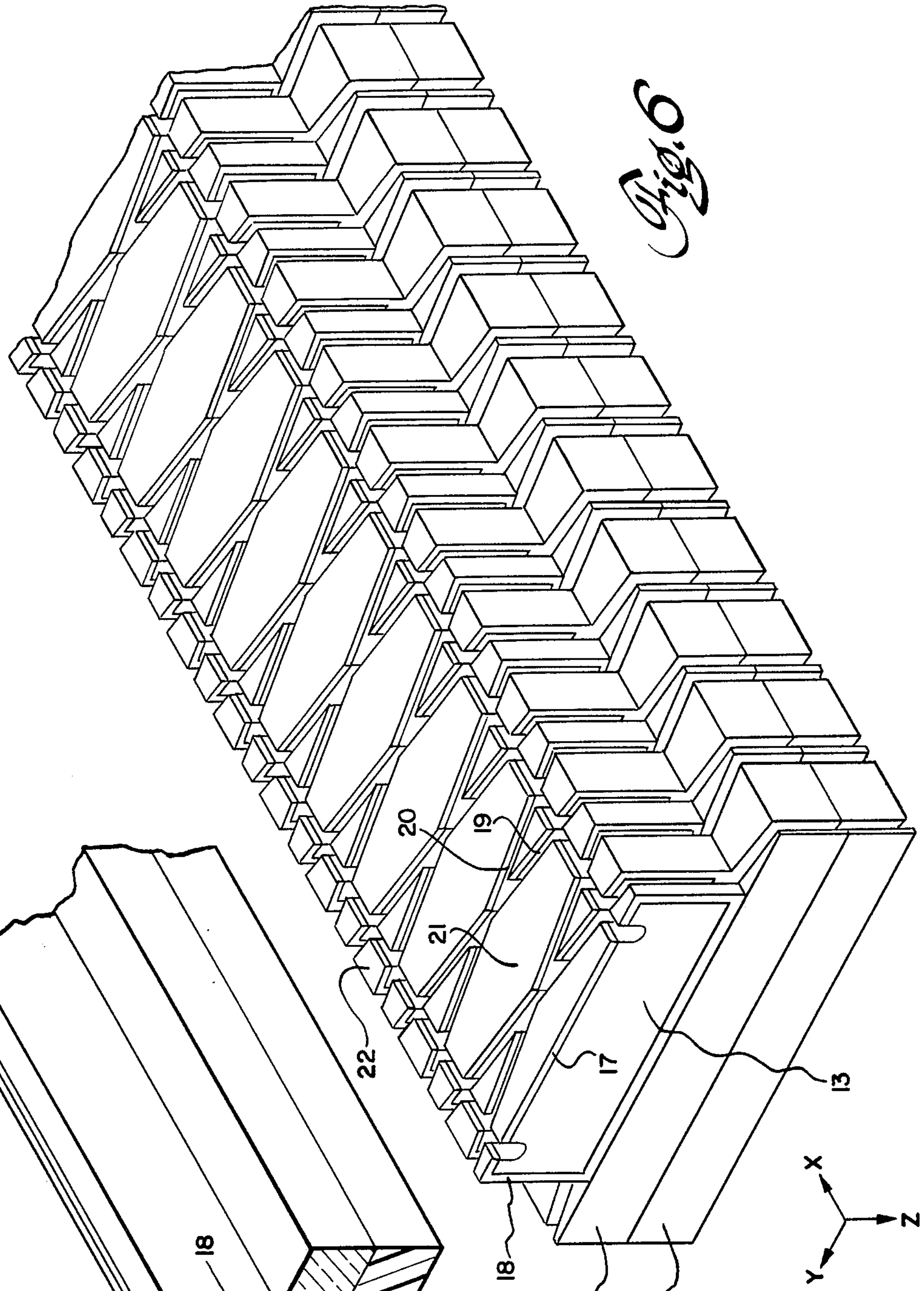
FIG. 6 is a perspective of the preferred embodiment, a phased array transducer.
Figure 5:
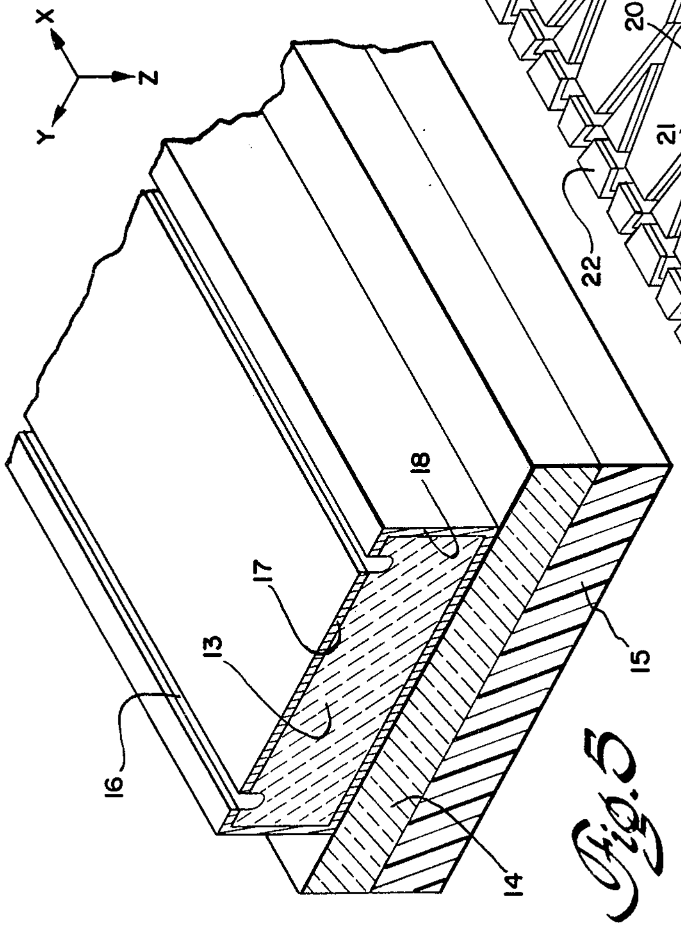
FIG. 5 is a cross section and partial perspective view of a plated piezoelectric slab bonded to impedance matching layers.

The method of manufacturing a Y-axis shaded linear phased array ultrasonic transducer is further explained with reference to FIGS. 5 and 6. More detail is given in U.S. Pat. No. 4,217,684, the disclosure of which is incorporated herein by reference. This patent is assigned to the assignee of this invention. A rectangular slab 13 of piezoelectric ceramic is plated with metal on all six sides and has a thickness of one-half wavelength at the emission frequency. The plated slab 13 is bonded to quarter-wave impedance matching layers 14 and 15 of glass (Pyrex ®) and plastic (Plexiglas ®). Isolation slots 16 are cut through the metal plating on the top surface of piezoelectric slab 13 to delineate signal and wrap-around ground electrodes 17 and 18. Two straight line cuts 19 and 20 at small angles to one another are made completely through the piezoelectric and impedance matching layer laminated structure and do not intersect at the sides of the slab. The substantially identical, approximately diamond-shaped elements 21 have flat ends. The plating covers the flat end and is continuous with the part of the ground electrode on the top surface and facilitates making connection to it. The severed triangular sections 22 are relatively small and are not removed. The remainder of the fabrication of the array may proceed as taught in the incorporated patent.

The improved beam patterns of these devices leads to important system advantages in linear array products. It can be incorporated in any linear array transducer for use with either rectilinear or sector imaging formats. Clinical experience is that side lobe reduction and high sensitivity are more important than good resolution for diagnostic medical ultrasound.

While the invention has been particularly shown and described with reference to preferred embodiments thereof, it will be understood by those skilled in the art that various changes in form and details may be made therein without departing from the spirit and scope of the invention.

We claim:

1. A shaded linear ultrasonic transducer array comprising a plurality of elongated transducer elements which have electrodes on opposite surfaces and are all wider at the center and narrower at either end such that in the Y-axis direction parallel to the element length the intensity of emitted ultrasound is greater at the center than at the ends of the array and the radiation pattern has reduced side lobe levels.

2. The transducer array of claim 1 wherein said transducer elements are substantially identical.

3. The transducer array of claim 2 wherein said transducer elements are approximately diamond-shaped.

4. A shaded linear phased array ultrasonic transducer comprising a plurality of substantially identical, elongated, fully cut through piezoelectric transducer elements which have electrodes on opposite major surfaces and are approximately diamond-shaped so that in the Y-axis direction parallel to the element length the intensity of emitted ultrasound is greater at the center than at the ends of the array and the Y-axis radiation pattern has reduced side lobe levels.

5. The transducer array of claim 4 wherein both ends of every element are flat and one electrode extends up the flat ends to the other surface and is separated from the other electrode.

6. The transducer array of claim 5 wherein at least one fully cut through impedance matching layer is bonded to every element.

* * * * *